(12) United States Patent
Yang et al.

(10) Patent No.: US 8,518,758 B2
(45) Date of Patent: Aug. 27, 2013

(54) ETSOI WITH REDUCED EXTENSION RESISTANCE

(75) Inventors: Bin Yang, Mahwah, NJ (US); Man Fai Ng, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 640 days.

(21) Appl. No.: 12/726,889

(22) Filed: Mar. 18, 2010

(65) Prior Publication Data
US 2011/0227157 A1    Sep. 22, 2011

(51) Int. Cl.
*H01L 27/12*    (2006.01)

(52) U.S. Cl.
USPC ........... 438/151; 438/459; 438/300; 438/163; 438/311

(58) Field of Classification Search
None
See application file for complete search history.

(56) References Cited

U.S. PATENT DOCUMENTS

| | | | |
|---|---|---|---|
| 5,708,303 A | 1/1998 | Jeng | |
| 6,297,539 B1 | 10/2001 | Ma et al. | |
| 6,885,084 B2 * | 4/2005 | Murthy et al. | 257/622 |
| 7,105,418 B2 | 9/2006 | Joo | |
| 7,154,779 B2 | 12/2006 | Mokhlesi et al. | |
| 7,253,053 B2 | 8/2007 | Eppich et al. | |
| 7,399,666 B2 | 7/2008 | Ahn et al. | |
| 7,535,695 B2 | 5/2009 | Basceri et al. | |
| 8,008,138 B2 * | 8/2011 | Cheng et al. | 438/157 |
| 8,106,456 B2 * | 1/2012 | Khater | 257/347 |
| 8,169,024 B2 * | 5/2012 | Cheng et al. | 257/347 |
| 2009/0242936 A1 * | 10/2009 | Cheng et al. | 257/190 |
| 2011/0024840 A1 * | 2/2011 | Khater | 257/347 |
| 2011/0042744 A1 * | 2/2011 | Cheng et al. | 257/347 |
| 2011/0127608 A1 * | 6/2011 | Cheng et al. | 257/347 |
| 2011/0175164 A1 * | 7/2011 | Bedell et al. | 257/347 |
| 2011/0227157 A1 * | 9/2011 | Yang et al. | 257/347 |

OTHER PUBLICATIONS

Ruzyllo et al., "High-k dielectric? Low-k dielectric?", Semiconductor Notes, Note No. 1, posted Apr. 15, 2003, 1 page, USA.

* cited by examiner

*Primary Examiner* — David E Graybill
(74) *Attorney, Agent, or Firm* — Ditthavong Mori & Steiner, P.C.

(57) ABSTRACT

A semiconductor is formed on an SOI substrate, such as an extremely thin SOI (ETSOI) substrate, with increased extension thickness. Embodiments include semiconductor devices having an epitaxially formed silicon-containing layer, such as embedded silicon germanium (eSiGe), on the SOI substrate. An embodiment includes forming an SOI substrate, epitaxially forming a silicon-containing layer on the SOI substrate, and forming a gate electrode on the epitaxially formed silicon-containing layer. After gate spacers and source/drain regions are formed, the gate electrode and underlying silicon-containing layer are removed and replaced with a high-k metal gate. The use of an epitaxially formed silicon-containing layer reduces SOI thickness loss due to fabrication process erosion, thereby increasing extension thickness and lowering extension resistance.

12 Claims, 7 Drawing Sheets

ETSOI WITH REDUCED EXTENSION RESISTANCE

TECHNICAL FIELD

The present disclosure relates to silicon-on-insulator (SOI), particularly extremely thin silicon-on-insulator (ET-SOI), and FinFET semiconductor devices with reduced extension resistance. The present disclosure is particularly applicable to semiconductors for 22 nanometer (nm) node devices and beyond.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. This fabrication technique may degrade the metal gate electrode or cause interaction with the gate dielectric, thereby adversely impacting transistor performance.

Replacement gate techniques have been developed to address problems attendant upon substituting metal gate electrodes for polysilicon gate electrodes. For example, an amorphous silicon (a-Si) or polysilicon gate is used during initial processing until high temperature annealing to activate source/drain implants has been implemented. Subsequently, the polysilicon is removed and replaced with a metal gate.

For improving low off-state leakage current, due to the fundamentally superior short channel control characteristics, ETSOI and FinFET are the best candidates for complementary metal-oxide-semiconductors (CMOS) beyond the 22 nm node. As illustrated in FIG. 1, an ETSOI semiconductor device begins with an ETSOI substrate comprising a silicon substrate 101, a buried oxide layer 103, and a thin silicon layer 105. A gate electrode 107 (including, from top to bottom, silicon nitride (SiN) cap 109, a-Si layer 111, and gate oxide layer 113) is patterned on the silicon layer of the ETSOI substrate. The silicon layer thickness is typically between about 6 nm and about 8 nm.

Adverting to FIG. 2A, during the patterning of gate electrode 107, the region 201 immediately adjacent to gate 107 is eroded by about 1 nm by the overetch process needed to insure that no gate-stack residual is left in the non-gated area. Then, in defining spacers 203, illustrated in FIG. 2B, the ETSOI is further thinned by about 1 to about 2 nm from the spacer etch/strip/clean steps, i.e., when the resist is stripped post halo extension implants. This causes very thin "bottleneck" ETSOI extension regions 205 that have a high extension resistance ($R_{ext}$) that is a few times higher than a conventional SOI or bulk CMOS.

An approach to mitigate the high ETSOI $R_{ext}$ is to form a raised source/drain 207 on the ETSOI by an epitaxial growth process. However, since the raised source/drain epitaxial growth does not change the silicon thickness at the thinnest portion of the extension, under the spacers 203 that separate the gate electrode from the source/drain epitaxial growth, the "bottle-neck" region cannot be remedied merely by forming raised source/drain 207. $R_{ext}$ is still dominated by the extension region resistance. High $R_{ext}$ limits the application of ETSOI to low power applications. In order to enable ETSOI for high performance logic devices, the $R_{ext}$ must be significantly reduced.

A need therefore exists for methodology enabling the formation of an SOI semiconductor device which is compatible with high-k metal gate integration and which has low off-state leakage current and reduced $R_{ext}$, and for the resulting device.

SUMMARY

An aspect of the present disclosure is an improved method of fabricating a semiconductor exhibiting improved short channel effects and reduced extension.

Another aspect of the present disclosure is a semiconductor exhibiting improved short channel effects and reduced extension resistance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor, the method comprising: forming an SOI substrate; epitaxially forming a silicon-containing layer on the SOI substrate; and forming a gate electrode on the epitaxially formed silicon-containing layer.

Aspects of the present disclosure include the SOI substrate comprising a thin layer of silicon, as at a thickness of about 6 nm to about 8 nm, on a silicon substrate, with a buried oxide layer (BOX) therebetween. Additional aspects include removing the gate electrode and forming a replacement gate electrode. Other aspects include forming a first spacer on each side of the gate electrode. Further aspects include forming raised source/drain regions adjacent each first spacer. Another aspect includes forming the source/drain regions as faceted source/drain regions. Other aspects include forming a second spacer on each first spacer; and forming a silicide on the source/drain regions. Another aspect includes removing the gate electrode, thereby exposing a portion of the silicon-containing layer; and removing the exposed portion of the silicon-containing layer. Additional aspects include removing the exposed portion of the silicon-containing layer by selectively etching the silicon-containing layer; and stopping on the SOI substrate. Other aspects include forming a replacement gate electrode on the SOI substrate between the first spacers. Further aspects include the replacement gate electrode comprising a high-k metal gate electrode. Additional aspects include forming the silicon-containing layer by epitaxially growing silicon germanium to a thickness of about 8 nm to about 12 nm.

Another aspect of the present disclosure is a semiconductor device comprising: an SOI substrate; a gate electrode formed on the SOI substrate; an epitaxially formed silicon-containing layer on the SOI substrate, surrounding the gate electrode.

Aspects include the SOI substrate comprising a thin silicon layer, as at a thickness of about 6 nm to about 8 nm, on a silicon substrate with a BOX therebetween. Further aspects include a first spacer on the silicon-containing layer on each side of the gate electrode and a source/drain region on the silicon-containing layer, adjacent each first spacer. Another aspect includes the source/drain regions being raised and faceted. Other aspects include a second spacer on each first spacer. Additional aspects include the gate electrode comprising a high-k metal gate electrode. Further aspects include the silicon-containing layer comprising silicon germanium at a thickness of about 8 nm to about 12 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the high $R_{ext}$ problem attendant upon etching the gate stack, forming the gate spacers, and removing the resist post halo implants in an SOI, particularly an ETSOI, semiconductor device. In accordance with embodiments of the present disclosure, an SOI semiconductor device is formed with an epitaxially formed silicon-containing layer on the SOI substrate. During a replacement gate process, the silicon-containing layer underlying the gate electrode is removed but the remaining silicon-containing layer is left on the SOI substrate. Consequently, the Si layer of the SOI substrate is not eroded during gate patterning and spacer formation. Therefore, the extension thickness is increased, thereby reducing the extension resistance. In addition, ETSOI substrates may be employed, such that short channel effects are also improved.

Methodology in accordance with embodiments of the present disclosure includes forming an SOI substrate, epitaxially forming a silicon-containing layer on the SOI substrate, and forming a gate electrode on the epitaxially formed silicon-containing layer. Gate spacers, source/drain regions, and second spacers are sequentially formed on the silicon-containing layer. In accordance with embodiments of the present disclosure, the gate electrode and underlying silicon-containing layer are removed and replaced with a high-k metal gate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
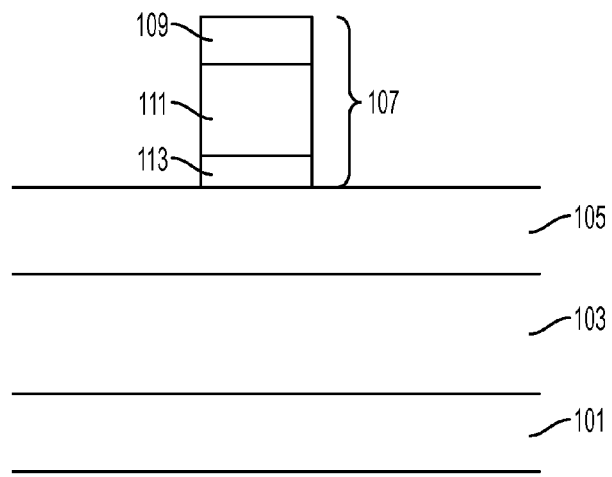
FIG. 1 schematically illustrates a conventional ETSOI semiconductor device.
Figure 2A:
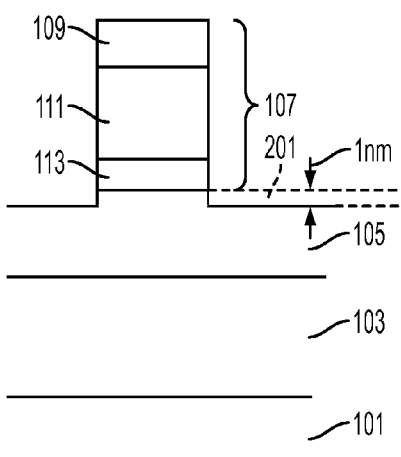
FIGS. 2A and 2B schematically illustrate ETSOI erosion during formation of an ETSOI semiconductor device.
Figure 2B:
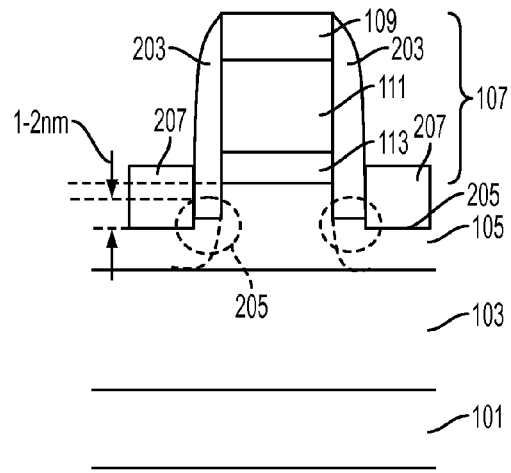
Figure 3:
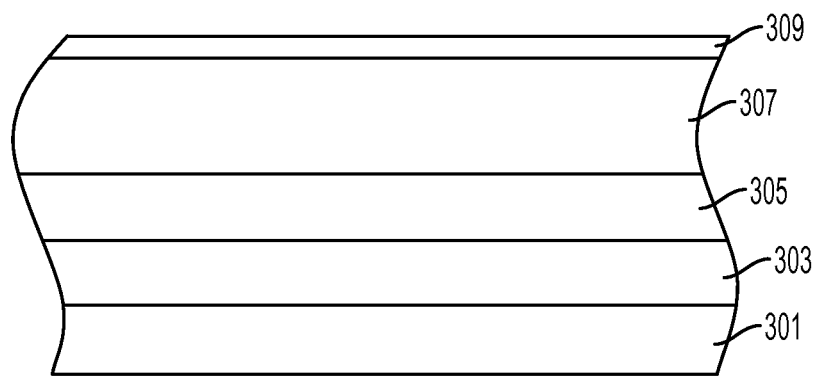
FIGS. 3 through 14 schematically illustrate sequential steps of a method in accordance with an exemplary embodiment.

A process for fabricating an SOI semiconductor, particularly an ETSOI semiconductor, in accordance with an embodiment of the present disclosure begins by forming an SOI substrate comprising silicon substrate 301, BOX 303, and SOI layer 305, as illustrated in FIG. 3. SOI layer 305 may be deposited to a thickness of about 6 nm to about 8 nm, thereby forming an ETSOI layer. Next, a silicon-containing layer 307, for example a SiGe layer, is epitaxially grown on ETSOI layer 305 to a thickness of about 8 nm to about 12 nm, e.g., about 10 nm. Alternatively, carbon doped silicon (Si:C) may be grown on ETSOI layer 305 to form silicon-containing layer 307. A protection layer 309, e.g., an oxide layer, is then deposited on silicon-containing layer 307.

Figure 4:
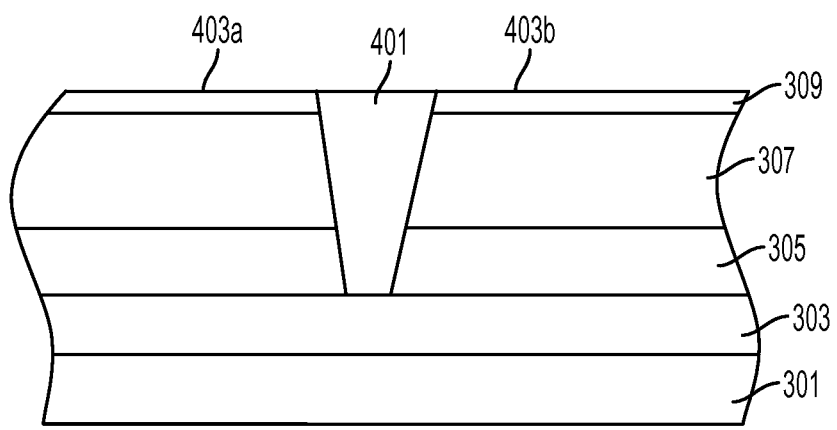

Adverting to FIG. 4, shallow trench isolation (STI) regions 401 are formed through protection layer 309, silicon-containing layer 307, and ETSOI layer 305. To the sides of STI regions 401, n and p well implants 403a and 403b are formed down to ETSOI layer 305. Both the STI formation and well implantation may be performed by conventional processes. Then, protection layer 309 is stripped away.

Figure 5:
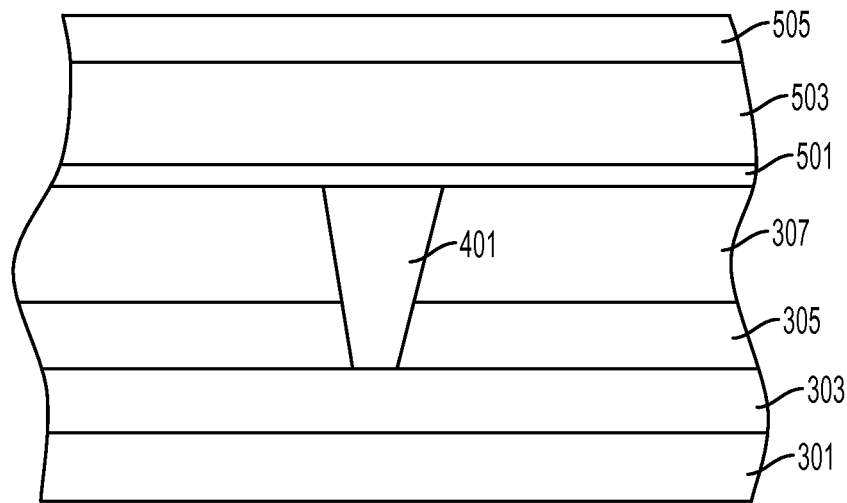
Figure 6:
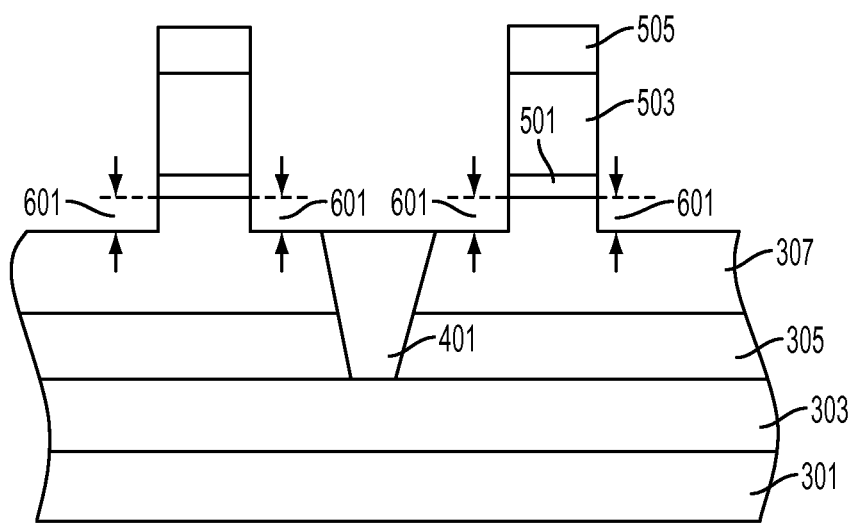

As illustrated in FIG. 5, a gate dielectric layer 501 is deposited over silicon-containing layer 307 and STI regions 401. Gate dielectric layer 501 may, for example, be an oxide. A gate electrode layer 503, for example a-Si or polysilicon, is then deposited over gate dielectric 501, followed by a capping layer 505, for example SiN. Gate electrodes are then patterned. The resulting structure is shown in FIG. 6. The etching of the gate electrodes causes an erosion of silicon-containing layer 307 on each side of the gate electrode by about 1 nm (shown at 601).

Figure 7:
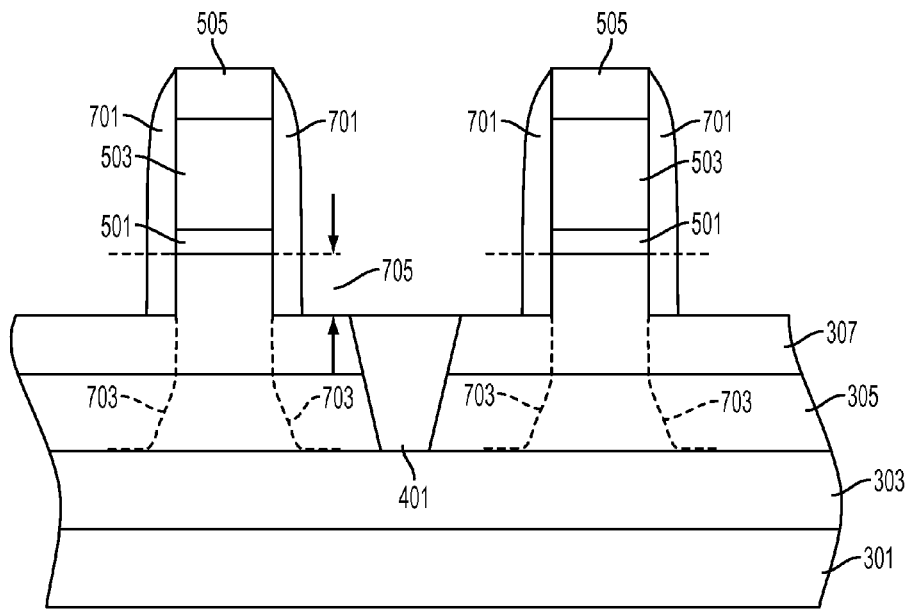

Adverting to FIG. 7, spacers 701, e.g., SiN nitride spacers, are deposited and etched. Halo and extension implantation and recrystallization annealing are performed to form extensions 703. As indicated at 705, additional erosion, e.g., about 1 nm to about 2 nm, of silicon-containing layer 307 occurs during formation of spacer 701.

Figure 8:
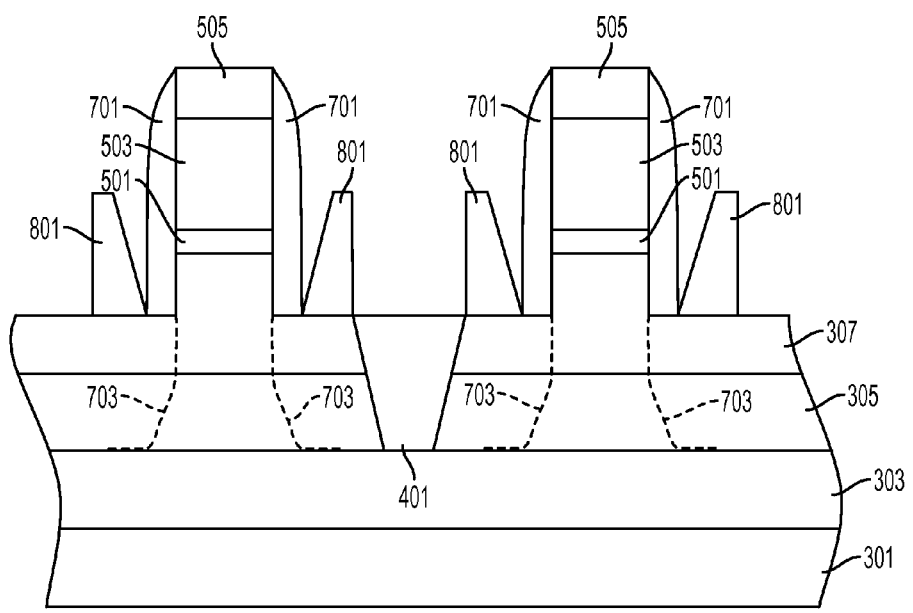

Source/drain regions 801 are next formed on silicon-containing layer 307. For example, as illustrated in FIG. 8, source/drain regions may be epitaxially formed with in-situ doping by conventional methods. As a result, source/drain regions 801 are faceted and raised, and an undesirable parasitic capacitance between source/drain regions 801 and the gate electrodes may be minimized. Alternatively, implantation may be performed to form source/drain regions 801.

Figure 9:
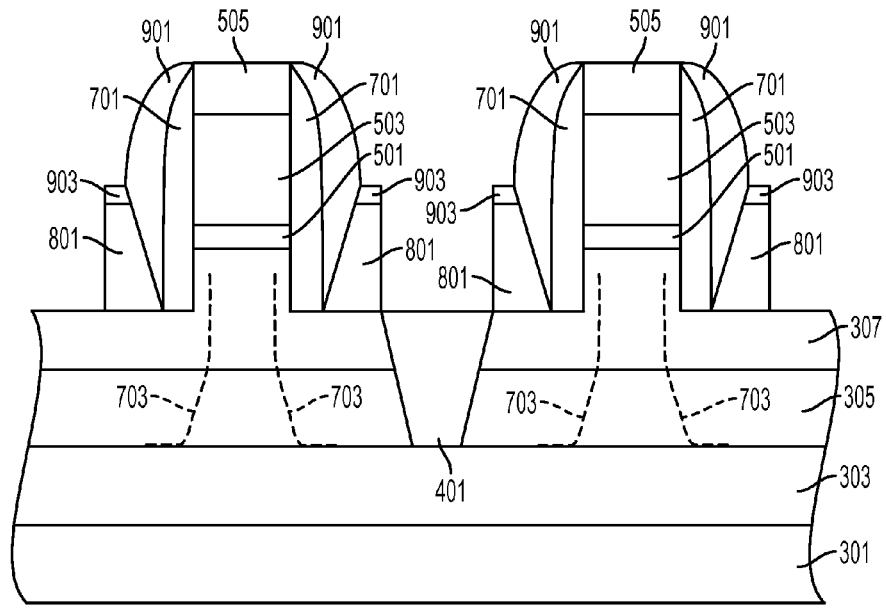

As illustrated in FIG. 9, final spacers 901 are formed on spacers 701. The device then undergoes rapid thermal annealing (RTA) or laser scribe annealing (LSA), or a combination thereof, to densify the spacers and to diffuse the source/drain dopants. Silicide 903 may then be formed on source/drain regions 801, or silicide 903 may be formed subsequent to forming replacement gates.

Figure 10:
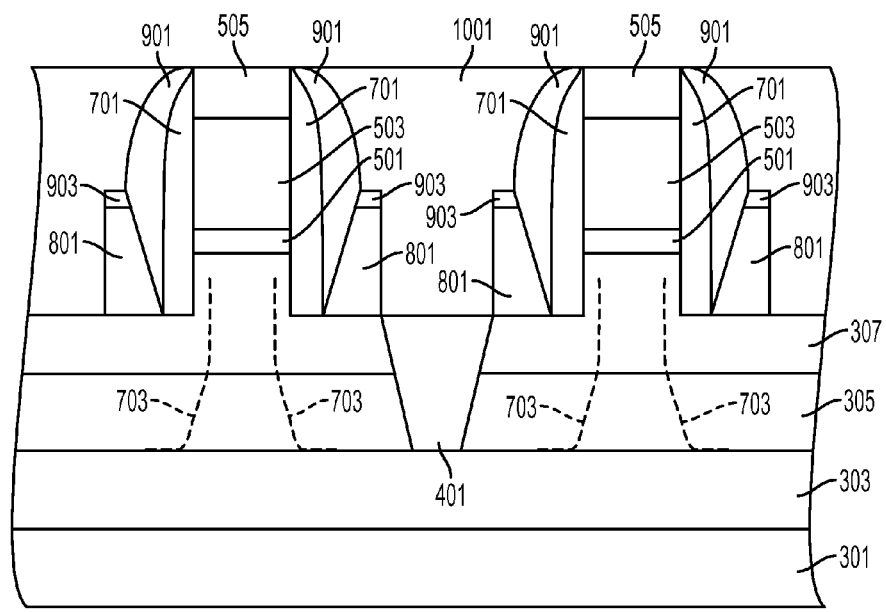
Figure 11:
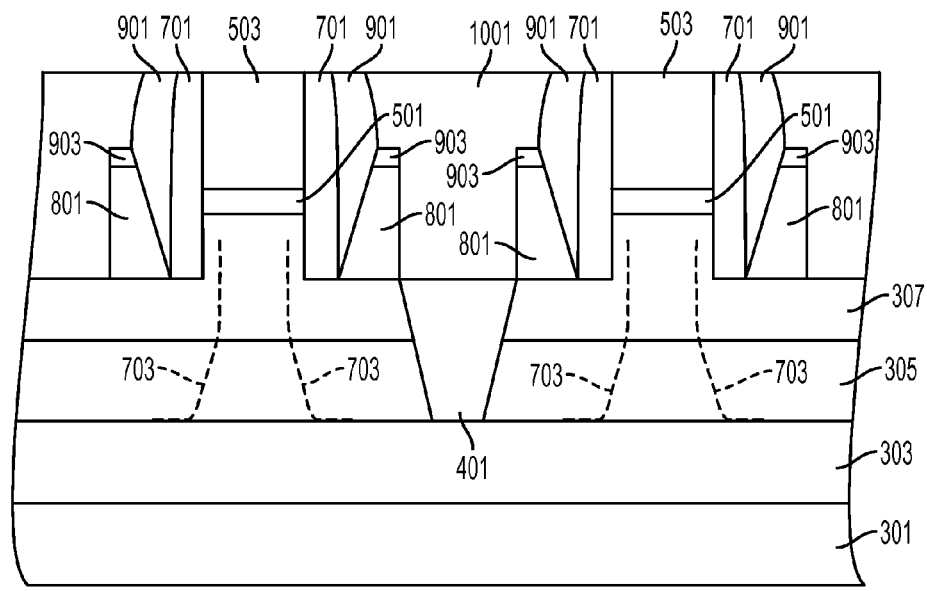

The replacement gate process begins in FIG. 10 by depositing and planarizing dielectric layer 1001. Then, chemical mechanical polishing (CMP) is performed to expose gate electrode layer 503, as illustrated in FIG. 11.

Figure 12:
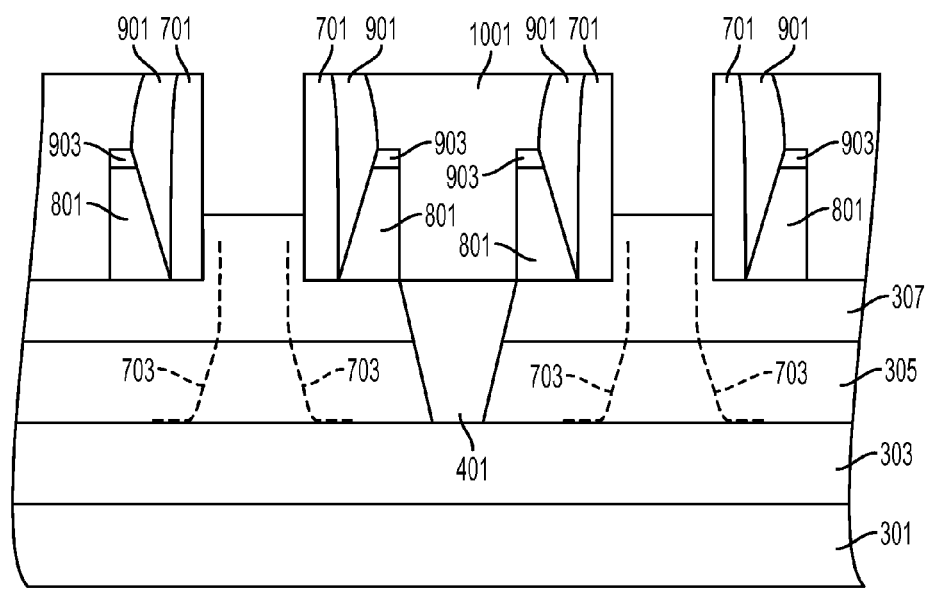
Figure 13:
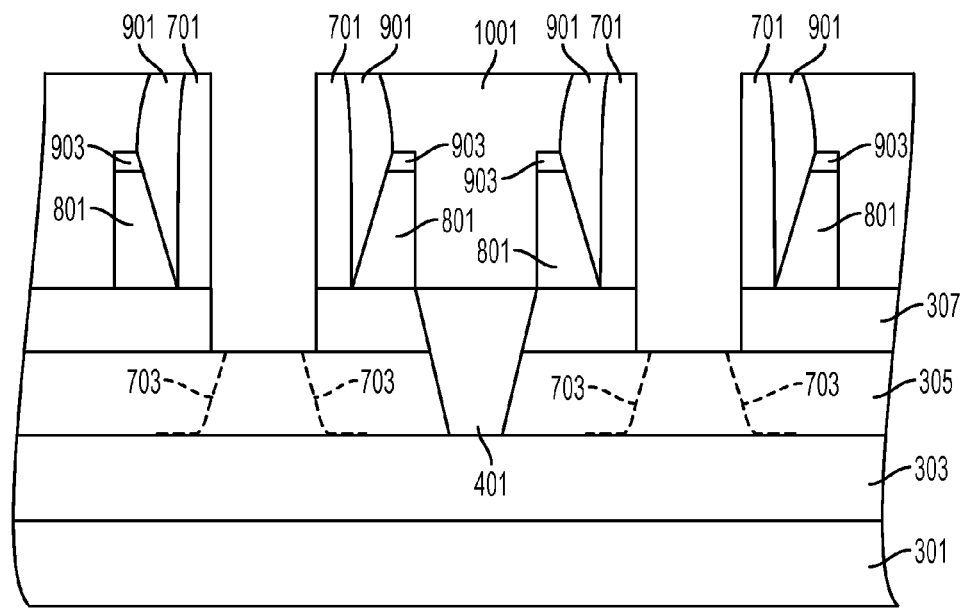

Adverting to FIG. 12, gate electrode layer 503 is etched out, followed by the removal of gate dielectric 501. Next, silicon containing layer 307 is selectively etched, stopping on ETSOI layer 305, as illustrated in FIG. 13.

Figure 14:
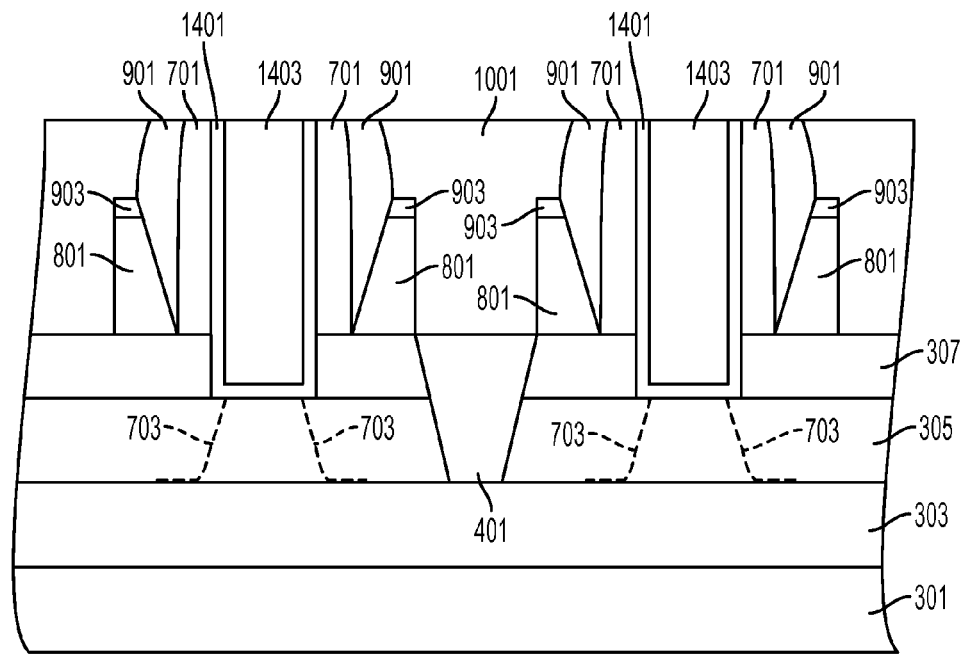

As illustrated in FIG. 14, a high k gate dielectric 1401, e.g., a hafnium based oxide, a hafnium based oxynitride, or a hafnium-silicon oxynitride is deposited on ETSOI layer 305. Next, metal gate liner (not shown) is deposited, and metal 1403, e.g., titanium nitride, tantalum nitride, or aluminum nitride, is filled between spacers 701. The metal gate formation ends with metal CMP.

The embodiments of the present disclosure can achieve several technical effects, including minimized ETSOI thickness loss due to erosion caused during gate patterning and spacer formation, reduced extension resistance from the resulting increased extension thickness, and improved short channel effects and shallow junction achieved by the low ETSOI thickness. The present disclosure enjoys industrial applicability in any of various types of highly integrated semiconductor devices particularly for 22 (nm) node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a semiconductor device, the method comprising:
    forming an SOI substrate;
    epitaxially forming a silicon-containing layer on the SOI substrate;
    forming a gate dielectric layer and gate electrode on the epitaxially formed silicon-containing layer;
    forming a first spacer on each side of the gate dielectric layer and gate electrode;
    removing the gate dielectric layer and gate electrode, thereby exposing a portion of the silicon-containing layer; and
    removing the exposed portion of the silicon-containing layer.

2. The method according to claim 1, wherein the SOI substrate comprises a thin silicon layer on a silicon substrate with a buried oxide layer (BOX) in between, the thin silicon layer having a thickness of about 6 nm to about 8 nm.

3. The method according to claim 1, further comprising:
    forming raised source/drain regions adjacent each first spacer.

4. The method according to claim 3, comprising forming the source/drain regions as faceted source/drain regions.

5. The method according to claim 3, further comprising:
    forming a second spacer on each first spacer; and
    forming a silicide on the source/drain regions.

6. The method according to claim 1, wherein removing the exposed portion of the silicon-containing layer comprises:
    selectively etching the silicon-containing layer; and
    stopping on the SOI substrate.

7. The method according to claim 1, further comprising forming a replacement gate electrode on the SOI substrate between the first spacers after removing the exposed portion of the silicon containing layer.

8. The method according to claim 7, wherein the replacement gate electrode comprises a high-k dielectric layer and a metal gate electrode.

9. The method according to claim 1, comprising forming the silicon-containing layer by epitaxially growing silicon germanium to a thickness of about 8 nm to about 12 nm.

10. A method of fabricating a semiconductor, the method comprising:
    forming an ETSOI substrate;
    epitaxially growing silicon germanium on the ETSOI substrate to a thickness of about 8 nm to about 12 nm;
    forming a gate dielectric layer and a gate electrode on the epitaxially formed silicon-containing layer;
    forming a first spacer on each side of the gate dielectric layer and the gate electrode;
    epitaxially forming a raised and faceted source/drain region on the silicon-containing layer, adjacent each first spacer;
    removing the gate dielectric layer and the gate electrode, thereby exposing a portion of the silicon-containing layer;
    selectively etching exposed portion of the silicon-containing layer, stopping on the ETSOI substrate;
    forming a high-k dielectric layer and a metal gate electrode on the ETSOI substrate between the first spacers.

11. The method according to claim 1, comprising forming the silicon-containing layer by epitaxially growing carbon-doped silicon (Si:C) to a thickness of about 8 nm to about 12 nm.

12. The method according to claim 1, comprising forming the gate dielectric layer and the gate electrode by:
    depositing a dielectric layer on the silicon-containing layer;
    depositing an amorphous silicon or polysilicon layer on the dielectric layer; and
    etching the dielectric layer and the amorphous silicon or polysilicon layer, leaving only a gate electrode and an underlying gate dielectric layer.

* * * * *